United States Patent
Glovatsky et al.

(10) Patent No.: US 6,807,060 B2
(45) Date of Patent: Oct. 19, 2004

(54) UNDERHOOD ELECTRONIC INTEGRATION

(75) Inventors: Andrew Glovatsky, Plymouth, MI (US); Myron Lemecha, Dearborn, MI (US); Lawrence Kneisel, Novi, MI (US); Brenda Nation, Troy, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 58 days.

(21) Appl. No.: 10/371,531

(22) Filed: Feb. 21, 2003

(65) Prior Publication Data

US 2004/0163617 A1 Aug. 26, 2004

(51) Int. Cl.⁷ .................................................. H05K 7/20
(52) U.S. Cl. ................... 361/707; 180/90; 296/189; 361/600; 361/679; 361/690; 361/826; 361/749
(58) Field of Search .................... 180/90; 296/189, 296/208; 307/10.1; 165/80.2, 80.3, 185; 174/16.3; 361/600, 679, 690, 704–721, 749, 820, 831

(56) References Cited

U.S. PATENT DOCUMENTS

| | | | |
|---|---|---|---|
| 4,065,170 A | 12/1977 | Fabian et al. | 296/37.1 |
| 4,152,021 A | 5/1979 | Götz et al. | 296/37.1 |
| 4,601,510 A | 7/1986 | Schöppel et al. | 296/194 |
| 5,417,471 A | 5/1995 | Kreis et al. | 296/194 |
| 5,481,433 A * | 1/1996 | Carter | 361/690 |
| 5,671,802 A | 9/1997 | Rogers | 165/41 |
| 5,712,764 A * | 1/1998 | Baker et al. | 361/690 |
| 5,856,908 A * | 1/1999 | Takiguchi et al. | 361/690 |
| 6,108,193 A * | 8/2000 | Haberstroh | 361/600 |
| 6,186,106 B1 | 2/2001 | Glovatsky et al. | 123/143 |
| 6,279,527 B1 | 8/2001 | Glovatsky et al. | 123/143 |

FOREIGN PATENT DOCUMENTS

| | | | | |
|---|---|---|---|---|
| DE | 4341355 | 6/1994 | | B62D/25/08 |
| DE | 19524165 | 8/1996 | | B62D/25/08 |

* cited by examiner

Primary Examiner—Gregory D. Thompson
(74) Attorney, Agent, or Firm—Brinks Hofer Gilson & Lione

(57) ABSTRACT

An electronic system generally includes a flatwire electronic site and a flatwire bus electronically connecting the flatwire electronic site and an electronic device in the engine compartment. The flatwire electronic site has a flexible substrate with electronic components attached to the substrate for operation of the electronic device. The flatwire electronic site is mounted to the engine side of the bulkhead for thermal cooling of the flatwire electronic site. A cover is attached to the bulkhead which encloses a flatwire electronic site for environmental protection.

20 Claims, 6 Drawing Sheets

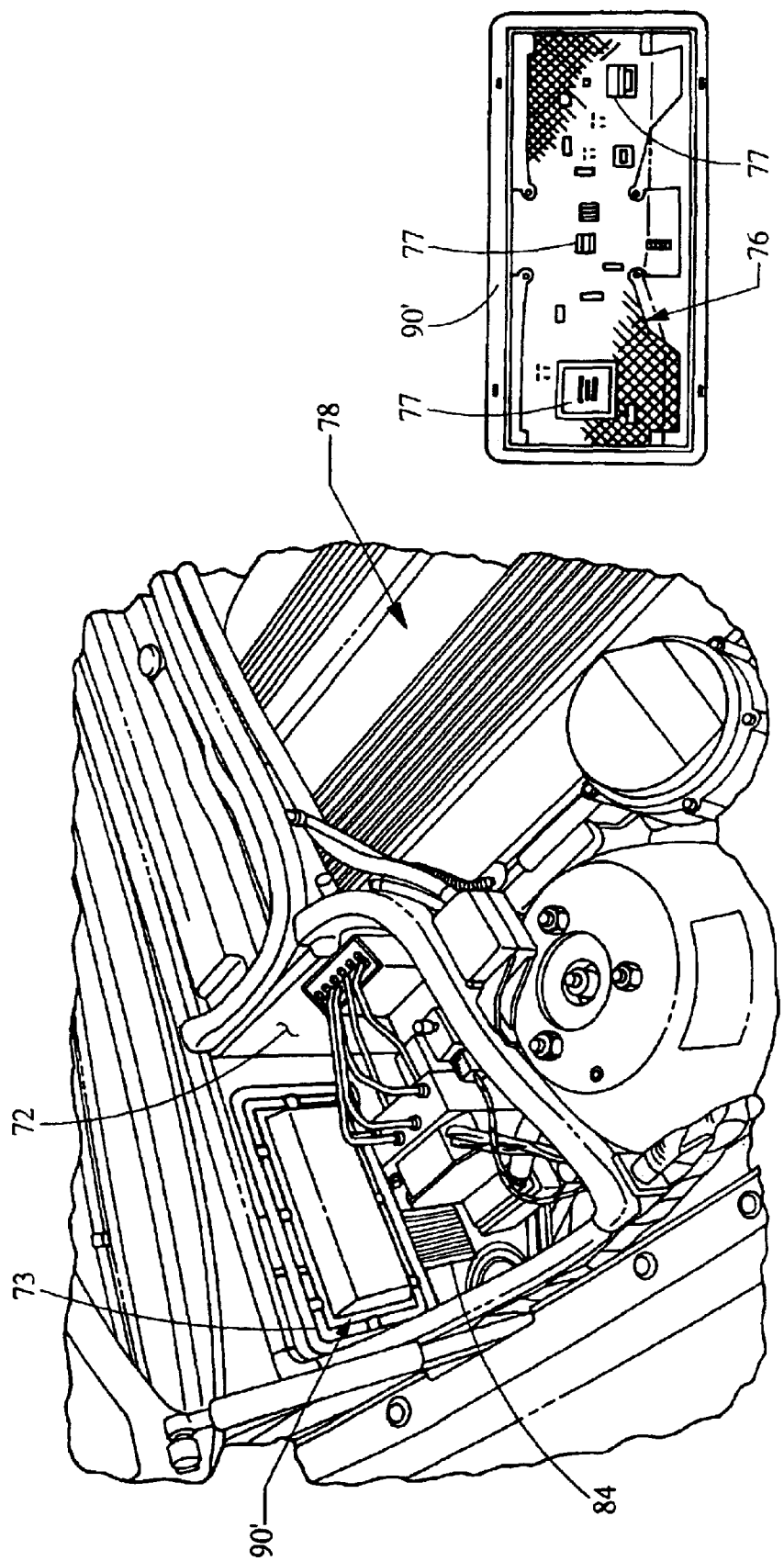

UNDERHOOD ELECTRONIC INTEGRATION

FIELD OF THE INVENTION

The present invention relates generally to underhood electronics in a motor vehicle, and more particularly relates to integration of these electronics.

BACKGROUND OF THE INVENTION

Underhood electronics are becoming more prevalent as more functions are contained under hood, such as antilock braking system, engine control, transmission control, variable valve timing, as well as numerous sensors and actuators. Currently, heavily sealed modules used to house various electronic boxes are installed underhood. These modules are very costly due to the high level of sealing and protection required, as well as the need for cooling of the electronics. Typically these modules include aluminum cast housings with cooling features, as well as a significant amount of bracketry to support the electronic boxes in the entire module. Further, these modules require connectors, pigtails, and wiring harnesses that are associated with each of the underhood electronic devices. Accordingly, there exits a need to provide an electronic system for the underhood devices of a motor vehicle which reduces the costs, packaging, volume and weight of the system, while increasing the serviceability and packaging efficiency of the system.

BRIEF SUMMARY OF THE INVENTION

The present invention provides an electronic system for a motor vehicle having a bulkhead separating an engine compartment and a passenger compartment, the engine compartment having an electronic device for performing a vehicle function. The electronic system generally includes a flatwire electronic site and a flatwire bus electronically connecting the flatwire electronic site and the electronic device in the engine compartment. The flatwire electronic site has a flexible substrate with electronic components attached to the substrate for operation of the electronic device. The flatwire electronic site is mounted to the engine side of the bulkhead for thermal cooling of the flatwire electronic site. Further, a cover is attached to the bulkhead which encloses a flatwire electronic site for environmental protection.

Preferably, the flatwire electronic site is mounted directly to the bulkhead utilizing a thermal adhesive or a thermal grease. Alternately, the flatwire electronic site is bonded into the cover, which is then secured to the bulkhead. The flatwire electronic site may be sealed with a conformal coating. The cover may provide electromagnetic shielding. Additional flatwire electronic sites may be provided, which are connected by the flatwire bus. The flatwire bus may also include a flatwire takeout directly linking a flatwire electronic site to the electronic device in the engine compartment.

BRIEF DESCRIPTION OF THE DRAWINGS

The accompanying drawings incorporated in and forming a part of the specification illustrate several aspects of the present invention, and together with the description serve to explain the principles of the invention. In the drawings:

FIGS. 6A and 6B is a perspective view similar to FIG. 5 but showing an alternate embodiment of the flatwire electronic site in its cover.

DETAILED DESCRIPTION OF THE INVENTION

Figure 1:
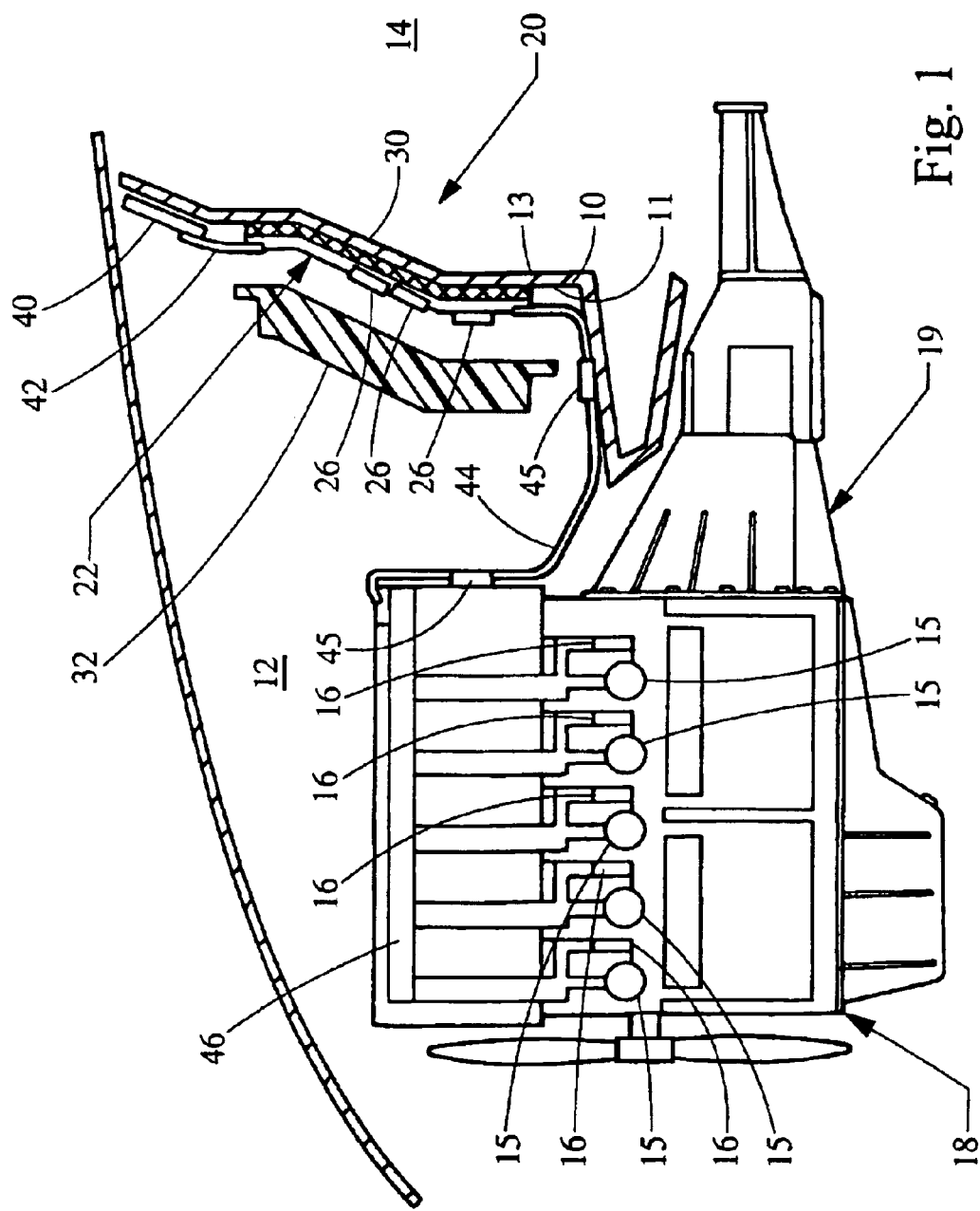
FIG. 1 is a cross-sectional view of an electronic system for underhood electronic devices constructed in accordance with the teachings of the present invention.

Turning now to the figures, FIG. 1 depicts a cross-sectional view of an electronic system 20 constructed according to the present invention. The electronic system 20 is for a motor vehicle 7 (partially shown in FIG. 3) having a bulkhead 10 separating an engine compartment 12 from a passenger compartment 14. Accordingly, the bulkhead 10 has an engine side 11 and a passenger side 13. The engine compartment 12 includes various electronic devices for performing one or more vehicle functions. In FIG. 1, the electronic devices have been depicted as both ignition coils 15 as well as fuel injectors 16 for an internal combustion engine 18. The engine 18 is connected to a transmission 19 as shown.

The electronic system 20 includes a flatwire electronic site 22 having a substrate 24 with a plurality of electronic components 26 attached thereto. The electronic components 26 are utilized to operate the electronic devices such as the ignition coils 15 and fuel injector 16 depicted in FIG. 1. It will be recognized that typical underhood electronic devices such as an engine control unit, antilock braking systems, speed control, ignition, lighting, transmission control, powertrain control, as well as various sensors or other actuators can be utilized with the present invention. Preferably, the electronic site 22 or a plurality of electronic sites 22 can be utilized to perform all of the underhood functions and features. In this way, control of the underhood electronic devices is integrated into one or a few electronic sites 22.

The electronic site 22 is attached to the bulkhead 10, and more particularly the engine side 11 of the bulkhead 10. Preferably, this is accomplished with a thermal attachment layer 30, which can comprise a thermal adhesive or thermal grease. The use of a thermal adhesive or grease 30 provides excellent heat transfer from the electronic site 22 to the metal bulkhead 10, providing for cooler electronics. It will be recognized that other attachment mechanism may be utilized such as typical fasteners, pins, adhesives, hook and loop fasteners, or the like. A cover 32 is preferably employed to encapsulate the electronic site 22. That is, the cover 32 includes an open side which faces the bulkhead 10 and is attached directly thereto. The bulkhead 10, in combination with the cover 32, encloses the electronic site 22 and protects the same from the environment.

Flatwire buses are utilized to provide circuitry to the electronic system 20. Specifically, a flatwire bus 40 is electronically connected to the site 22, preferably by way of direct soldering with or without a patch 42. Alternatively, flatwire connectors may be utilized as is known in the art. The flatwire bus 40 includes flatwire takeouts 44, which are typically used to route directly from the electronic sites to sensors, actuators or other controllers of electronic devices in the engine compartment 12. These takeouts 44 are flatwire buses, but are typically small and are used to directly couple a few signals and power lines between an electronic site and its sensor, actuator or display. In replacement of flatwire, light channel buses or composite light channel with metal conductors can be used to interconnect sites, sensors, and actuators or other electronic devices.

As shown in FIG. 1, the flatwire takeout 44 links the electronic site 22 to a second flatwire takeout 46 which is mounted directly on the engine 18 The flatwire takeout 46 includes a plurality of linkages to each of the injection coils 15 and injectors 16 of the engine 18. Clips 45 are used to attach the flatwire circuitry to structure in the engine compartment 12 such as the bulkhead 10 and the engine 18.

Figure 2:
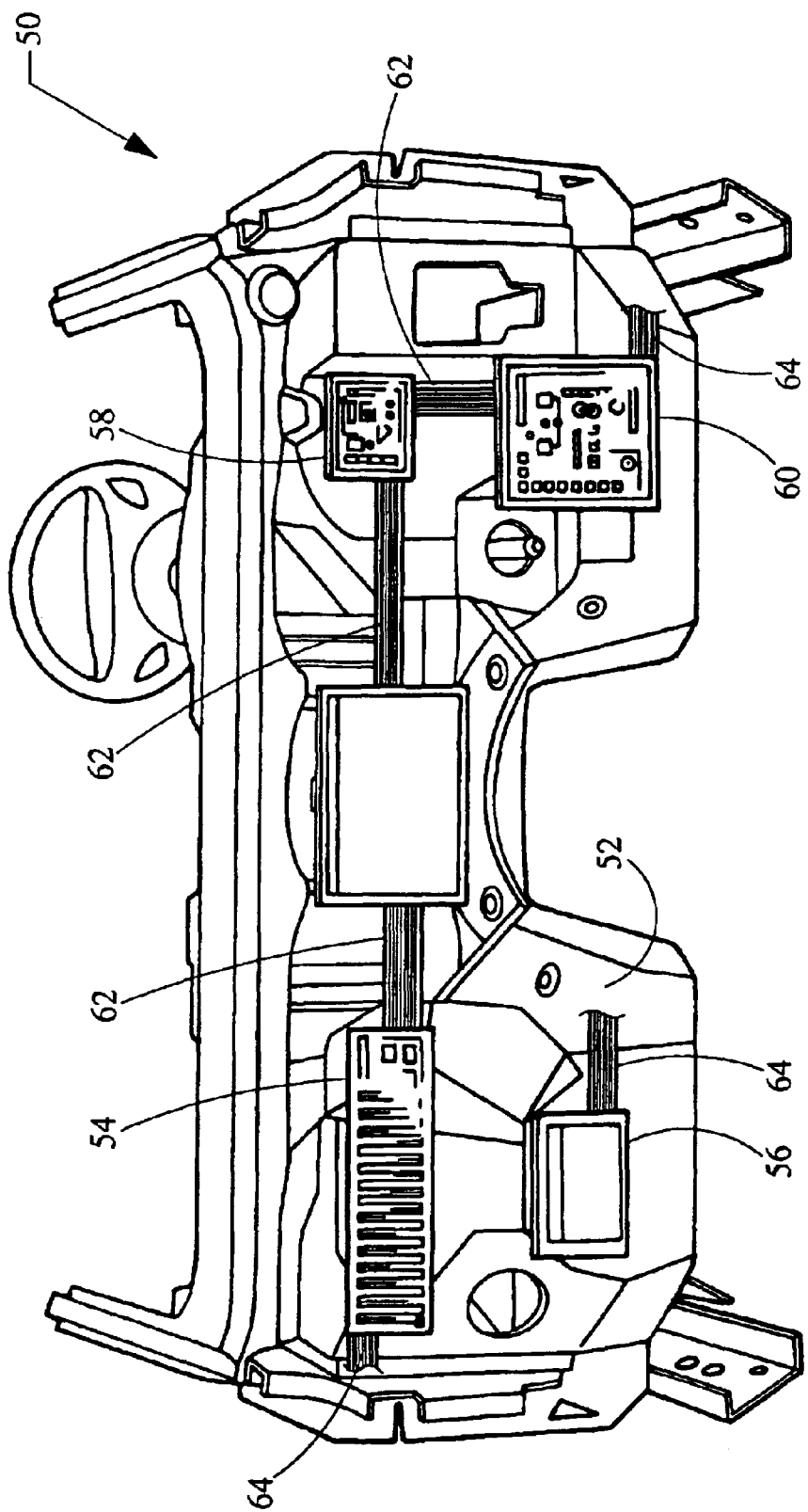
FIG. 2 is a front view depicting flatwire electronic sites of the electronic system mounted to the bulkhead.

Turning now to FIG. 2, a front view of an embodiment of the electronic system 50 is shown. The vehicle's bulkhead 52 is shown having a first electronic site 54, a second electronic site 56, a third electronic site 58, and a fourth electronic site 60 attached to the engine side of the bulkhead 52. A flatwire bus system 62 electronically connects the electronic sites 54, 56, 58, 60 and includes flatwire takeouts 64 for directly connecting the electronic sites to respective electronic devices (not shown). The second electronic site 56 is shown having a cover 66 attached to the bulkhead 52 for protecting the electronic site 56, while the other flatwire sites 54, 58, 60 have been shown with their covers removed.

Figure 3:
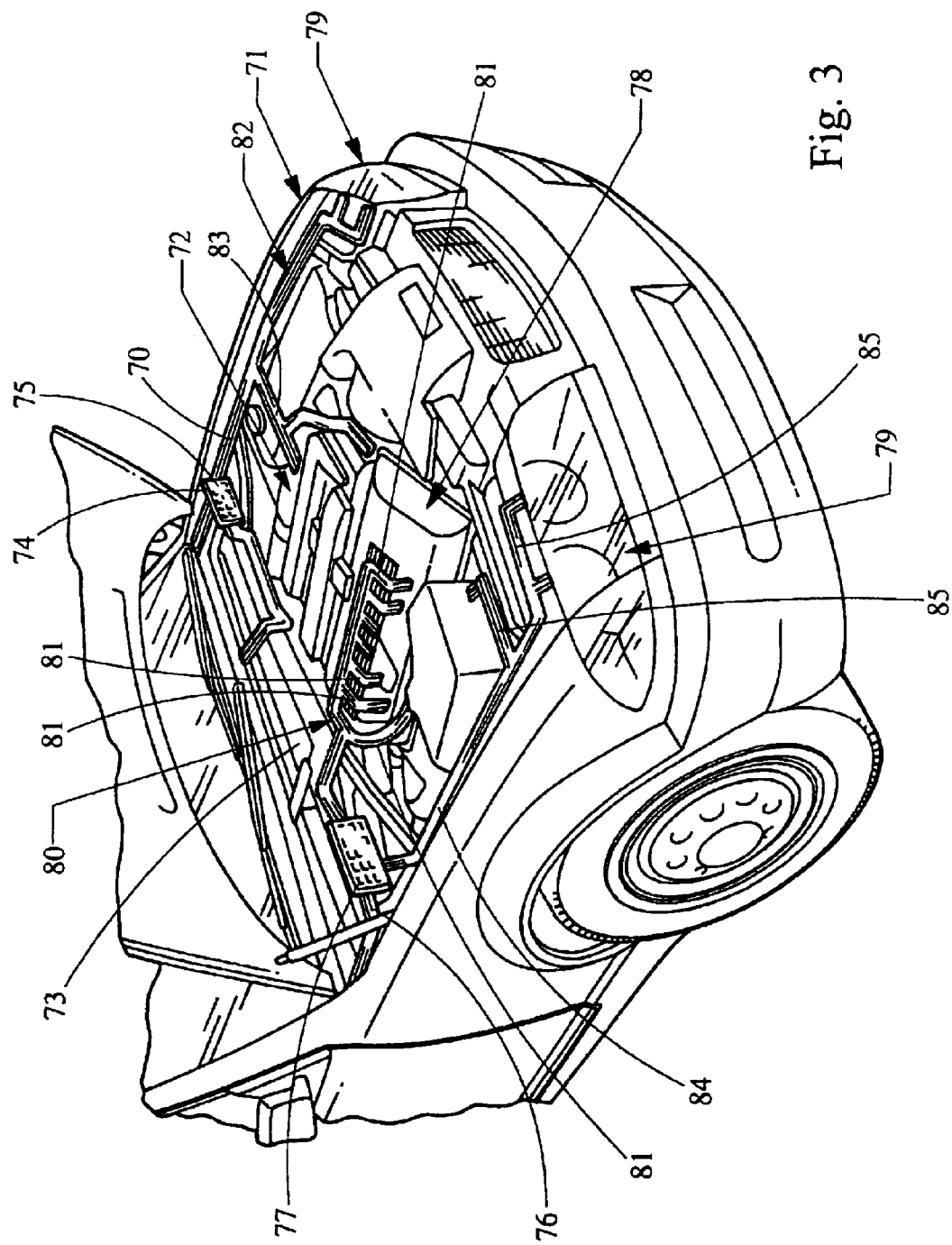
FIG. 3 is a perspective view depicting another embodiment of the electronic system for underhood electronic devices constructed in accordance with the teachings of the present invention.

A perspective view of a related electronic system 70 is shown applied to a vehicle 71 in FIG. 3. The vehicle includes an engine compartment 72 having a bulkhead 73 separating the passenger compartment from the engine compartment 72. The electronic system 70 generally includes a first electronic site 76 and a second electronic site 74. The electronic sites 74, 76 include electronic components 75, 77 for operating an underhood electronic device such as the engine 78 and the front lights 79.

As shown, a first flatwire bus 80 connects the first electronic site 76 to the engine 78. Similarly, a second flatwire bus 82 connects the second electronic site 74 to the driver side front light 79, while the first electronic site 76 is linked to the passenger side front light 79 via a third front wire bus 84. It can be seen that the first flatwire bus 80 includes flatwire tails 81 for direct connection to the actuators, such as the ignition coils or fuel injectors on the engine 78. Likewise the second flatwire bus 82 includes numerous flatwire tails 83 for connection to various actuator such as the light system 79 or a control unit such as a transmission control, power train control, antilock braking system or the like. Similarly, the third flatwire bus 84 includes similar flatwire tails 85 also linked to underhood electronic devices. All the flatwire sites are interconnected through a flatwire bus system comprising the first, second and third flatwire buses 80, 82, 84. The flatwire is connected to each electronic site in any known manner such as direct soldering connections. Other connectors or methods of bonding can be used such as flatwire connectors.

Figure 4:
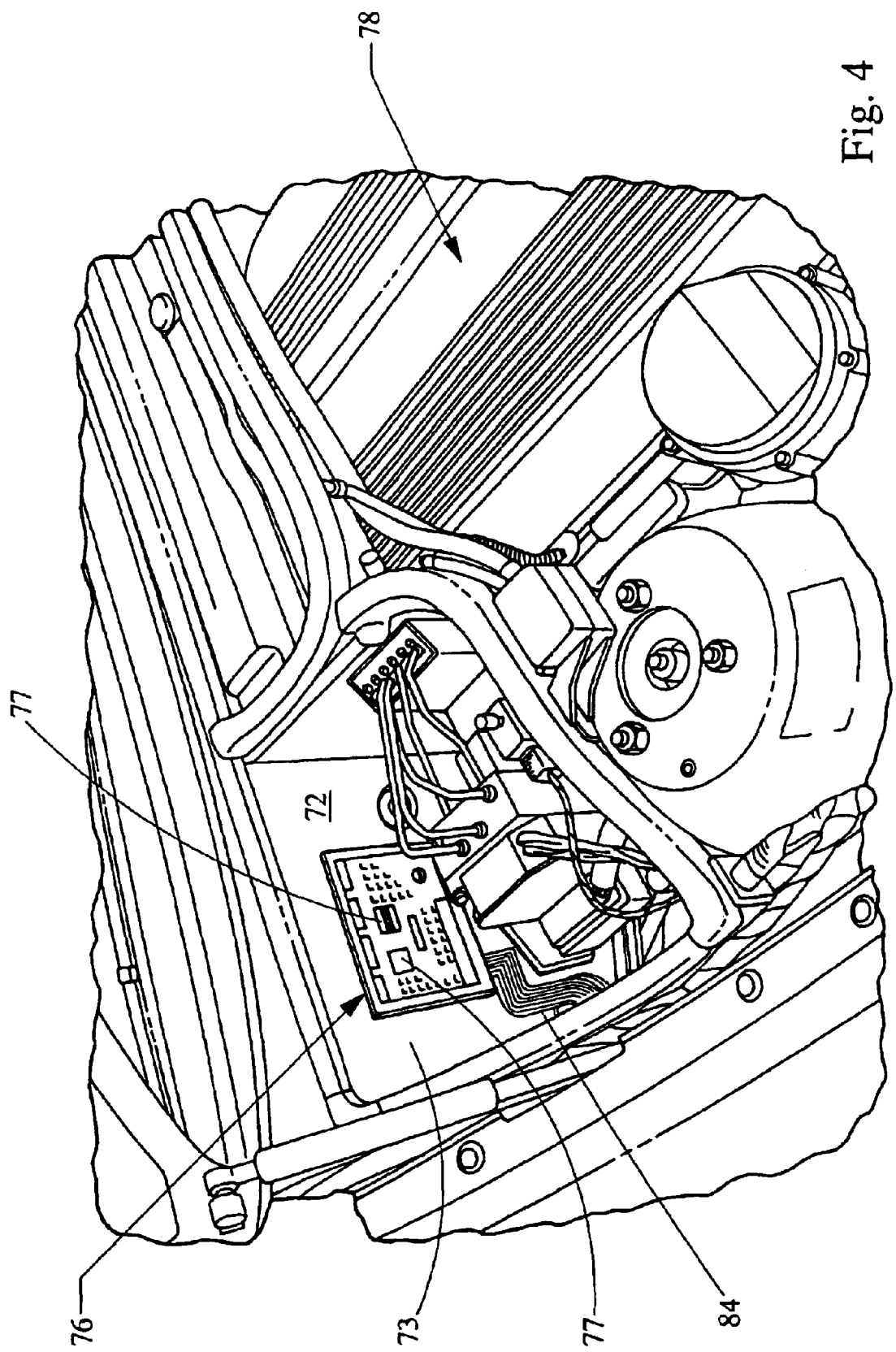
FIG. 4 is an enlarged view, partially cut away, of the electronic system shown in FIG. 3.
Figure 5:
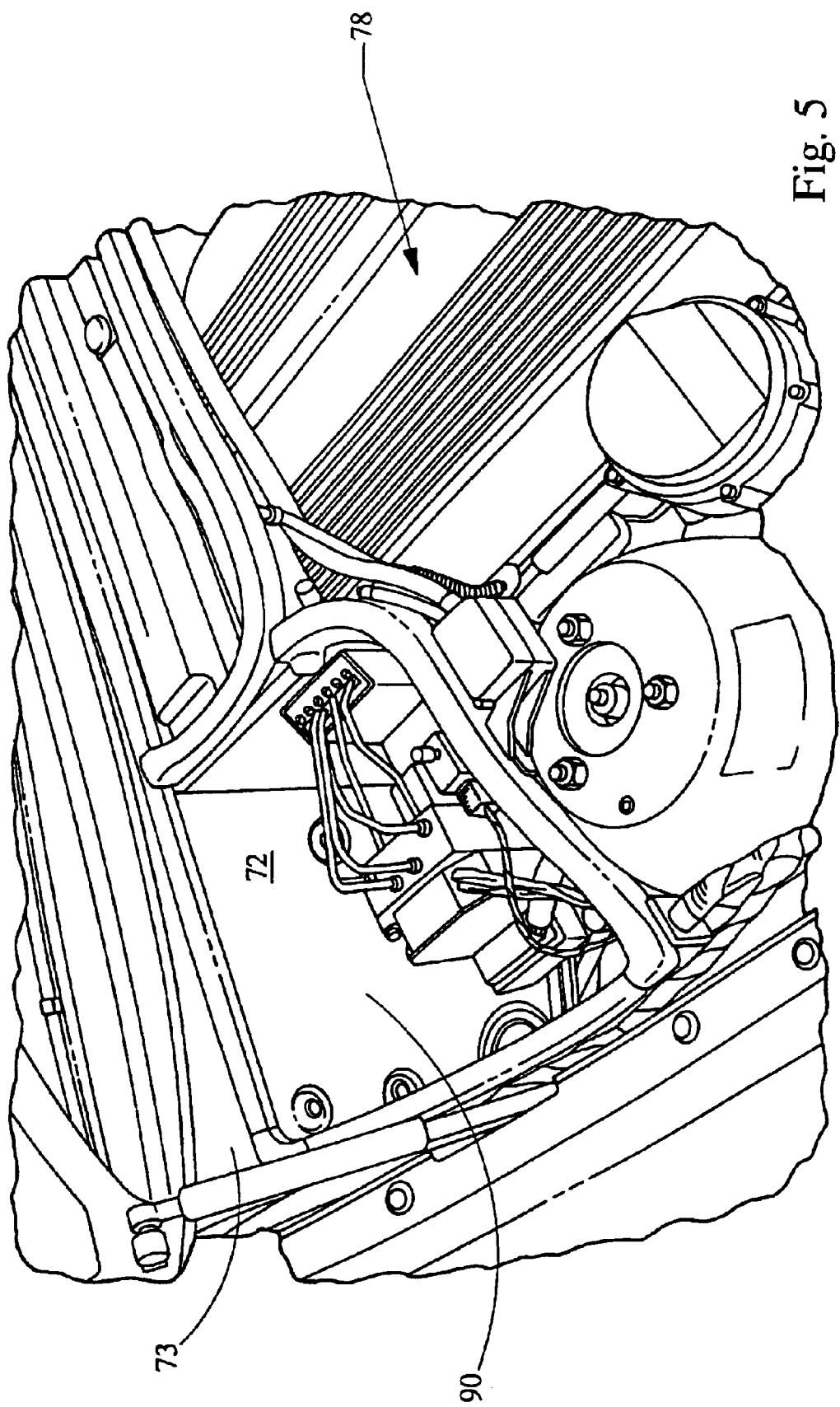
FIG. 5 is a perspective view similar to FIG. 4 but showing a cover attached to the bulkhead.

FIG. 4 depicts an enlarged view, partially cut away, of the first flatwire electronic site 76 attached to the bulkhead 73. The flatwire bus 84 extends away from the flatwire electronic site 76 for connection to an underhood electronic device such as the light system 79. The flatewire electronic site 76 is mounted directly to the bulkhead, which provides for thermal cooling of the electronic components 77. A similar view is shown in FIG. 5, however a cover 90 has been attached to the bulkhead 73 covering the first electronic site 76. As shown, the cover 90 is bolted directed to the bulkhead 73, although, it could be mounted to the outer periphery of the flatwire electronic site 76.

Finally, FIGS. 6A and 6B show an alternate embodiment of the cover 90'. This cover 90' comprises a plastic molding having the flatwire electronic site bonded directly to the cover 90'. Thus, by mounting the cover 90' to the bulkhead 73 (preferably using threaded fasteners), the flatwire electronic site 76 is connected to the bulkhead 73 which provides thermal cooling. The cover 90' has an open sides that is attached facing the bulkhead 73. Accordingly, the bulkhead 73, in combination with the cover 90', encapsulates the flatwire electronic site 76. In this manner, the flatwire electronic site 76 is protected from the harsh environment of the engine compartment 72. The cover 90' is preferably constructed of a plastic. Alternately, the cover 90' may be constructed of a metallized plastic or sold metal in order to provide some electromagnetic interference shielding.

The flatwire busses and tails can be comprised of numerous materials such as PET, PEN, polyimide, Thin FR4, FR4 and similar materials. A conformal coating may be used to seal the electronics. The conformal coating may be a material such as silicone, epoxy or acrylic. The flatwire may be protected with a coverlay such as PET or polyimide, or alternatively a soldermask material such as epoxy. This coverlay or soldermask protects the flatwire bus from the harsh environment of the engine compartment 72. The flatwire buses can be attached to a metal or plastic surfaces in the engine compartment 72 as needed. Further, rigidizers or flexible supports can be added to the flatwire buses. These rigidizers may be routed in air between underhood structures.

Accordingly, it can be seen that by integrating the underhood electronics into several flexible flatwire electronic sites, the electronics may be located on the bulkhead of the vehicle. In this way, the large amount of wiring and bracketry ordinarily required for these underhood electronics is greatly reduced. Further, the bulkhead provides excellent heatsinking of the electronics, improving their performance and reliability while further eliminating the need for bulky cooling features that otherwise be required. A significant reduction in size and weight are achieved while the serviceability and packaging efficiency are greatly improved.

What is claimed is:

1. An electronic system for a motor vehicle having a bulkhead separating an engine compartment and a passenger compartment, the bulkhead having an engine side and a passenger side, the engine compartment having an electronic device for performing a vehicle function, the electronic system comprising:

a flatwire electronic site having a flexible substrate and electronic components attached to the substrate for operation of the electronic device;

a flatwire bus electronically connected to the flatwire electronic site and the electronic device in the engine compartment for transmitting signals therebetween;

the flatwire electronic site being mounted to the engine side of the bulkhead for thermal cooling of the flatwire electronic site; and a cover attached to the bulkhead and enclosing the flatwire electronic site for environmental protection.

2. The electronic system of claim 1, wherein the flatwire electronic site is mounted directly to the bulkhead.

3. The electronic system of claim 1, wherein the flatwire electronic site is mounted to the bulkhead with a thermal adhesive.

4. The electronic system of claim 1, wherein the flatwire electronic site is mounted to the bulkhead with a thermal grease.

5. The electronic system of claim 1, further comprising a flexible plastic sheet bonded to the flatwire bus for supporting the flatwire bus within the engine compartment.

6. The electronic system of claim 1, wherein the flatwire electronic site is sealed with a conformal coating.

7. The electronic system of claim 1, wherein the electronic device is an injector of an engine.

8. The electronic system of claim 7, wherein the flatwire bus is supported directly on the engine.

9. The electronic system of claim 7, wherein the flatwire electronic site comprises circuitry for an engine control unit.

10. The electronic system of claim 1, wherein the electronic device is a vehicle light.

11. The electronic system of claim 1, wherein the cover provides electromagnetic shielding.

12. The electronic system of claim 1, wherein the flatwire electronic site is bonded into the cover.

13. The electronic system of claim 1, further comprising a second flatwire electronic site mounted to the engine side of the bulkhead, the second flexible electronic site being electronically connected to the first electronic site via the flatwire bus.

14. The electronic system of claim 13, wherein the flatwire bus electronically connects the flatwire electronic sites together.

15. The electronic system of claim 13, wherein the flatwire bus includes a flatwire takeout directly linking the flatwire electronic site to the electronic device.

16. The electronic system of claim 1, further comprising a second flatwire electronic site mounted to the engine side of the bulkhead, the second flatwire electronic site having a flexible substrate and electronic components attached to the substrate for operation of a second electronic device in the engine compartment.

17. An electronic system for a motor vehicle having a bulkhead separating an engine compartment and a passenger compartment, the bulkhead having an engine side and a passenger side, the engine compartment having electronic devices for performing vehicle functions, the electronic system comprising:

a first flatwire electronic site having a flexible substrate and electronic components attached to the substrate for operation of the electronic device;

a second flatwire electronic site having a flexible substrate and electronic components attached to the substrate for operation of the electronic device;

a flatwire bus electronically connecting the first and second flatwire electronic sites and the electronic devices in the engine compartment for transmitting signals therebetween; and the first and second flatwire electronic sites being mounted to the engine side of the bulkhead for thermal cooling.

18. The electronic system of claim 17, wherein the first and second flatwire electronic sites are mounted directly to the bulkhead.

19. The electronic system of claim 17, wherein the first and second flatwire electronic sites are mounted to the bulkhead with a thermal adhesive.

20. The electronic system of claim 17, wherein the flatwire bus includes a first flatwire takeout and a second flatwire takeout, the first flatwire takeout directly linking the first flatwire electronic site to an electronic device, the second flatwire takeout directly linking the second flatwire electronic site to an electronic device.

* * * * *